United States Patent
Liu et al.

(10) Patent No.: US 12,153,100 B1
(45) Date of Patent: Nov. 26, 2024

(54) EMERGENCY STARTING POWER SUPPLY WITH CONTACT IMPEDANCE DETECTION

(71) Applicant: GREPOW, Inc., Livermore, CA (US)

(72) Inventors: Bing Liu, Shenzhen (CN); Shiyu Liu, Shenzhen (CN); Bing Guo, Shenzhen (CN); Shixing Zhao, Shenzhen (CN)

(73) Assignee: GREPOW INC., Livermore, CA (US)

( * ) Notice: Subject to any disclaimer, the term of this patent is extended or adjusted under 35 U.S.C. 154(b) by 0 days.

(21) Appl. No.: 18/642,160

(22) Filed: Apr. 22, 2024

(30) Foreign Application Priority Data

Apr. 16, 2024 (CN) .......................... 202410457352.3

(51) Int. Cl.
*G01R 31/67* (2020.01)
*F02N 11/14* (2006.01)
*G01N 27/02* (2006.01)
*G01R 31/69* (2020.01)

(52) U.S. Cl.
CPC .............. *G01R 31/67* (2020.01); *F02N 11/14* (2013.01); *G01N 27/028* (2013.01); *G01R 31/69* (2020.01)

(58) Field of Classification Search
None
See application file for complete search history.

(56) References Cited

U.S. PATENT DOCUMENTS

| | | | |
|---|---|---|---|
| 4,286,172 A | 8/1981 | Millonzi et al. | |
| 5,435,759 A | 7/1995 | Adams et al. | |
| 11,686,778 B1 * | 6/2023 | Wu | F02N 11/0862 324/432 |
| 12,025,675 B2 * | 7/2024 | Ogirko | H02J 7/0048 |
| 2017/0012448 A1 | 1/2017 | Miller et al. | |
| 2017/0346140 A1 * | 11/2017 | Koebler | H01M 4/5825 |
| 2019/0081492 A1 * | 3/2019 | Toscani | H02J 7/342 |

FOREIGN PATENT DOCUMENTS

CN 106936181 A 7/2017

OTHER PUBLICATIONS

International Search Report mailed on Jul. 15, 2024, in connection with corresponding International Application No. PCT/US2024/025687 (10 pages).

* cited by examiner

*Primary Examiner* — Jared Fureman
*Assistant Examiner* — Joel Barnett
(74) *Attorney, Agent, or Firm* — McCormick, Paulding & Huber PLLC

(57) ABSTRACT

A method and apparatus of an emergency starting power supply used to start a device or energize a battery. This emergency starting power supply automatically detects the contact impedance of the device or battery and provides prompts from a user interface to the user based on this detected contact impedance. The prompts guide the user as the user on how to adjust the impedance of the connections to the device or battery so that it is connected optimally to the device or battery so that the emergency starting power supply can provide the device or battery with enough energy to start the motor or engine.

18 Claims, 10 Drawing Sheets

EMERGENCY STARTING POWER SUPPLY WITH CONTACT IMPEDANCE DETECTION

CROSS-REFERENCE TO RELATED APPLICATION

This application claims foreign priority benefits under 35 U.S.C. § 119 to Chinese Patent Application No. 202410457352.3 filed on Apr. 16, 2024, the content of which is hereby incorporated by reference in its entirety.

TECHNICAL FIELD

The present invention pertains to the field of power supplies, and in particular to power supplies used to power a device.

BACKGROUND

Devices such as vehicles include a battery to power the motor or engine of the vehicle, as well as other vehicle components. Devices with one or more electric motors or a gasoline engine require a substantial amount of power from the battery to start the motor(s) or engine. It is typical for this starting power to be three to nine times the power required to run the motor(s) or engine once the motor(s) or engine have been started. As a result, an old battery that is cold or that has not been used for an extended period may not be able to supply enough power to start the motor(s) or engine.

A device battery that is old, cold or not used for an extended period can be charged using a battery charger so the battery can supply the power the device needs to start the motor(s) or engine. However, charging a battery can take a long time, and accessing the battery to remove it from the device or to attach a charger to the battery while the battery is still in the device can be onerous. As a result, an emergency starting power supply can be used as an alternative to charging the battery because the emergency starting power supply can provide the power required directly to the device when starting the motor(s) or engine.

Additionally, the device and battery may have dirty, rusted, and/or corroded connection points. This can happen when the device is old, a device used in a harsh environment, or due to many other reasons. These dirty, rusted, and/or corroded connection points can result in the device and battery having large contact impedances. These large contact impedances can result in a suboptimal connection between the emergency starting power supply, the device and/or the battery. As a result, the emergency starting power supply cannot provide the power the device needs to start the motor(s) or engine. These suboptimal connections can also result in dangerous situations, such as sparks being created and the potential for starting a fire.

Accordingly, there is a need for an apparatus and method that at least partially addresses one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present disclosure is to provide a power supply configured to power a vehicle.

In accordance with a first embodiment of the present disclosure, there is provided a power supply configured to power a device. The power supply comprising a first clamp configured to connect to a positive contact of the device and a second clamp is configured to connect to a negative contact of the device. The power supply also comprising a detection module, connected to the first clamp and the second clamp, used to detect the impedance of the device's positive contact, and also used to detect the impedance of the device's negative contact. The power supply also comprising a power switch, connected between the first clamp and an energy module or between the second clamp and the energy module. The power supply also comprising a system control module is electrically connected to the detection module to obtain the contact impedance of the first clamp and the contact impedance of the second clamp and provides a signal to the power switch to turn on the power switch so that the energy module provides energy to the first clamp and the second clamp.

In accordance with a second embodiment of the present disclosure, there is provided a power supply configured to power a device. The power supply comprising a first clamp configured to connect to a positive contact of the battery and a second clamp is configured to connect to a negative contact of the battery. The power supply also comprising a detection module, connected to the first clamp and the second clamp, used to detect the impedance of the battery's positive contact, and also used to detect the impedance of the battery's negative contact. The power supply also comprising a power switch, connected between the first clamp and an energy module or between the second clamp and the energy module. The power supply also comprising a system control module is electrically connected to the detection module to obtain the contact impedance of the first clamp and the contact impedance of the second clamp and provides a signal to the power switch to turn on the power switch so that the energy module provides energy to the first clamp and the second clamp.

Embodiments have been described above in conjunction with aspects of the present disclosure upon which they can be implemented. Those skilled in the art will appreciate that embodiments may be implemented in conjunction with the aspect with which they are described but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present disclosure will become apparent from the following detailed description, taken in combination with the appended drawings, in which.

It will be noted that throughout the appended drawings, like features are identified by like reference numerals.

DETAILED DESCRIPTION

The present disclosure provides methods for an emergency starting power supply. The user of the emergency starting power supply can start a device using energy provided by the emergency starting power supply and typically uses the emergency starting power supply when the device or a battery cannot provide sufficient energy to start the device.

The device or system of this present disclosure comprises as non-limiting examples of the device being a vehicle, a drone, a boat, a scooter and a bicycle.

The emergency starting power supply can be configured to detect the contact impedance of the device or alternatively a battery. As a result, the apparatus and method automatically measures the contact impedance of the device or the battery connected to the emergency starting power supply and, based on this measured contact impedance, prompt the user on how to adjust the impedance of connections to the device or battery so that they are optimally connected to the device or battery to provide the device with enough energy to start the motor(s) or engine of the device.

Figure 1A:
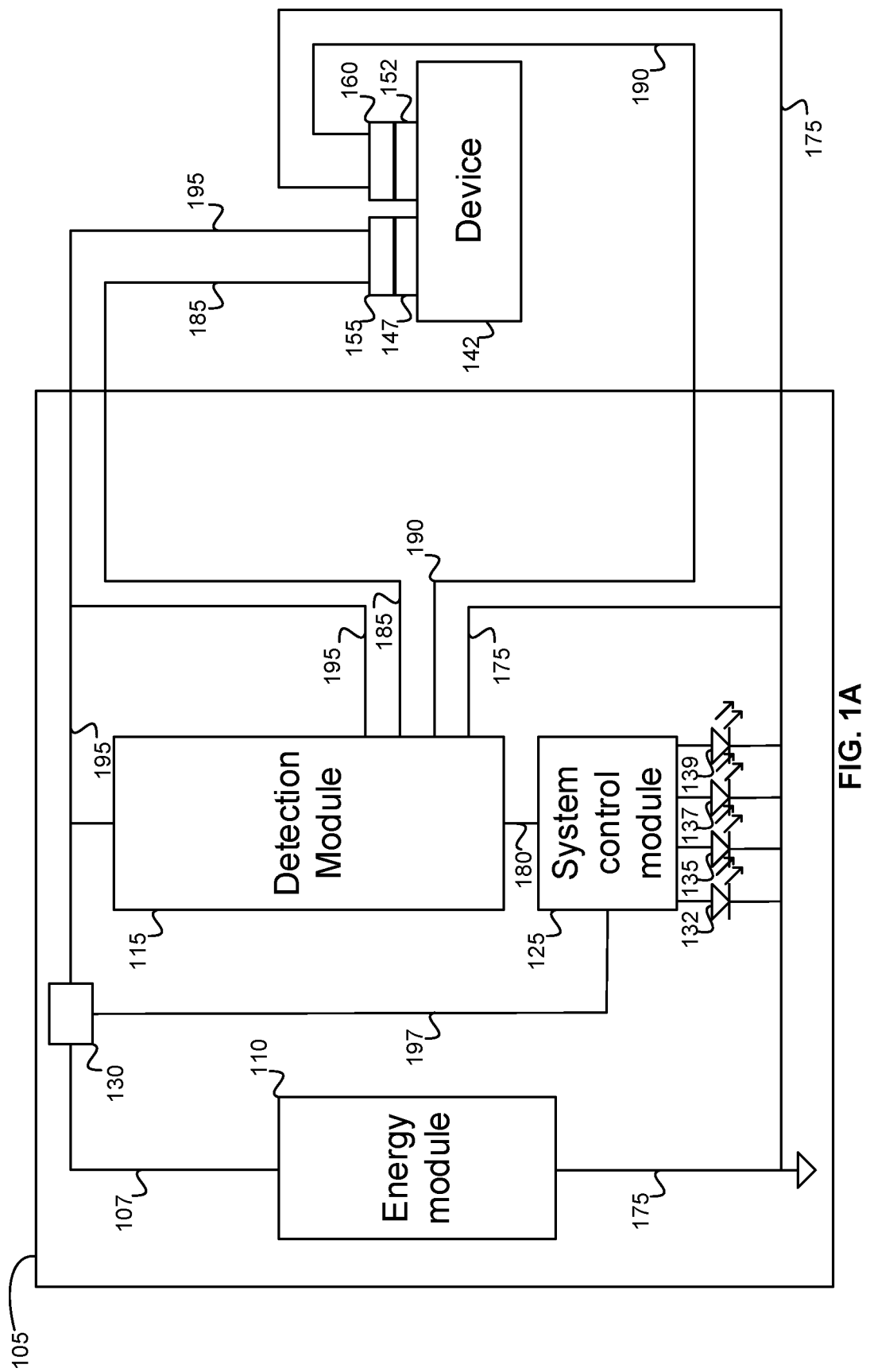
FIG. 1A illustrates a block diagram of the emergency starting power supply with device contact impedance detection according to an embodiment of the present disclosure.

FIG. 1A illustrates the emergency starting power supply 105 connected to a device 142. Emergency starting power supply 105 is connected to first clamp 155 using wire 195 which in turn is connected to contact 147. Emergency starting power supply 105 is connected to second clamp 160 using wire 175 which in turn is connected to contact 152. Emergency starting power supply 105 is also connected to contacts 147 and 152 of device 142 using wire 185 that is independently connected to clamp 155 and wire 190 that is independently connected to clamp 160. Those skilled in the art will appreciate that the independent connection of wires 185 and 195 means that wires 195 and 185 are connected to a different physical location of first clamp 155 and that wires 175 and 190 are connected to a different physical location of second clamp 160 and that impedance can be adjusted by adjusting the physical locations where these independent connections are made to the clamps. Embodiments of this disclosure can use this difference in physical location to more accurately determine the impedance of the contact.

Energy module 110 is connected to switch 130 using wire 107 so that when switch 130 is engaged, energy module 110 is connected to device 142 using wire 195. As shown in FIG. 1A, system control module 125 is connected to switch 130 and this connection allows system control module 125 to engage power switch 130. It should be appreciated that a current loop path is created between energy module 110 and device 142 when system control module 125 engages switch 130.

When battery clamps 155 and 160 are connected to contacts 147 and 152 of device 142, the emergency starting power supply 105 detects that emergency starting power supply 105 is connected to device 142.

Figure 1B:
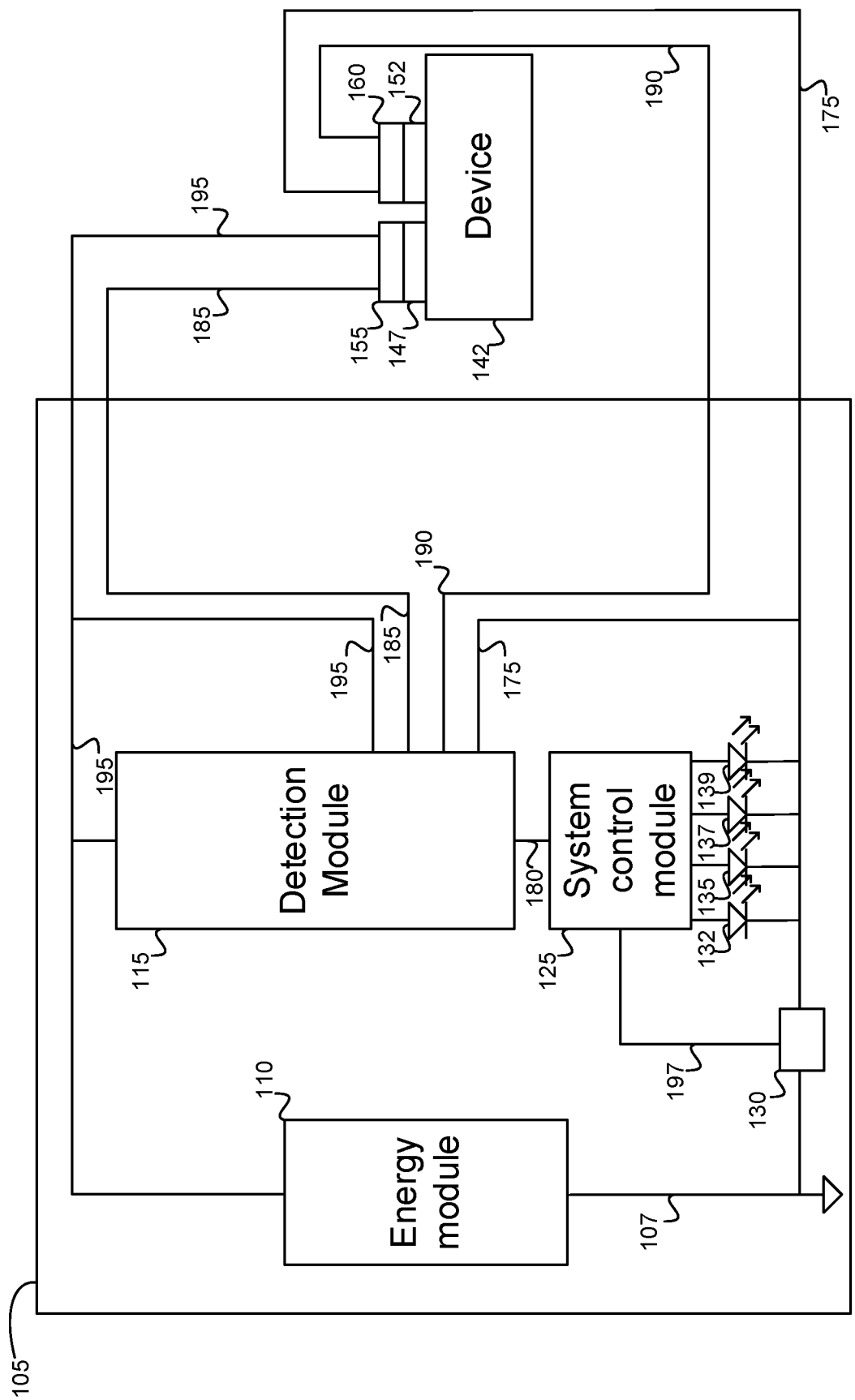
FIG. 1B illustrates a block diagram of the emergency starting power supply with device contact impedance detection according to an embodiment of the present disclosure.

FIG. 1B performs the same charging and discharging and measurements as FIG. 1A, except that switch 130 is located within the ground circuit instead of being located within the non-ground circuit. Switch 130 is located in the ground circuit when switch 130 comprises an appropriate device acting as a switch. Non-limiting examples of devices acting as a switch can be an N-MOS transistor, a relay or one or more like devices. A person skilled in the art will understand that when switch 130 comprises an N-MOS transistor, a relay or one or more like devices, placing switch 130 in the ground circuit results in emergency power supply 105 operating more reliably and also more safely.

Figure 1C:
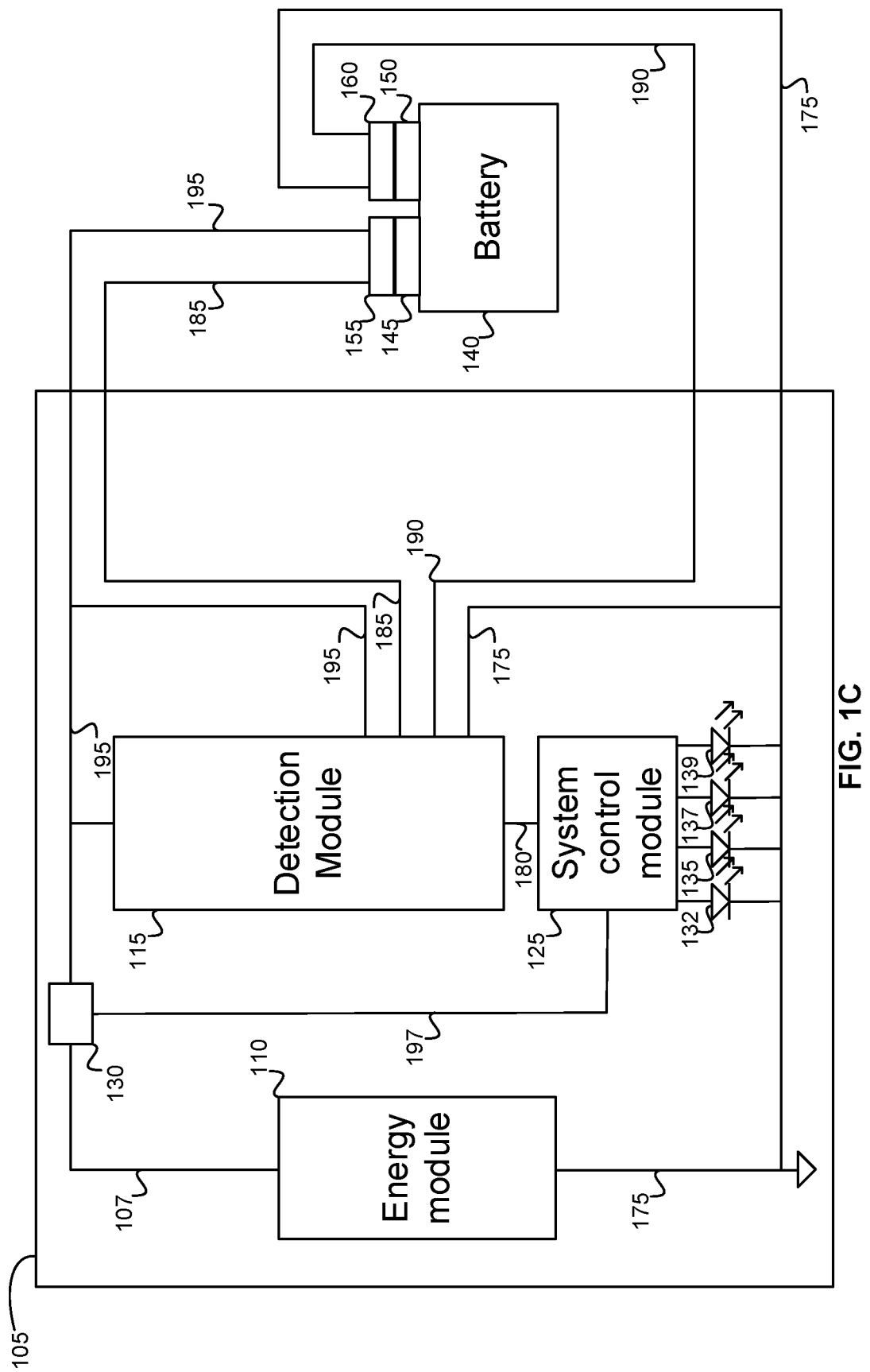
FIG. 1C illustrates a block diagram of the emergency starting power supply with device battery contact impedance detection according to an embodiment of the present disclosure.

FIG. 1C illustrates the emergency starting power supply 105 connected to battery 140. Emergency starting power supply 105 is connected to first clamp 155 using wire 195 which is in turn is connected to contact 145 of battery 140. Emergency starting power supply 105 is connected to second clamp 160 using wire 175 connected to second clamp 160 which is in turn connected to contact 150 of battery 140. Emergency starting power supply 105 is also connected to contacts 145 and 150 of battery 140 using wire 185 that is independently connected to clamp 155 and wire 190 that is independently connected to clamp 160. Independent connections of wires 195 and 185 to clamp 155 and wires 175 and 190 to clamp 160 are previously described herein.

Energy module 110 is connected to switch 130 using wire 107 so that when switch 130 is engaged, energy module 110 is connected to battery 140 using wire 195. As shown in FIG. 1C, system control module 125 is connected to switch 130 and this connection allows system control module 125 to engage power switch 130. It should be appreciated that a current loop path is created between energy module 110 and battery 140 when system control module 125 engages switch 130.

When battery clamps 155 and 160 are connected to battery 140 contacts 145 and 150, the emergency starting power supply 105 detects that emergency starting power supply 105 is connected to battery 140.

When emergency starting power supply 105 detects that it is connected to battery 140, system control module 125 can control the switching of switch 130 so that battery 140 can be discharged or charged.

Figure 1D:
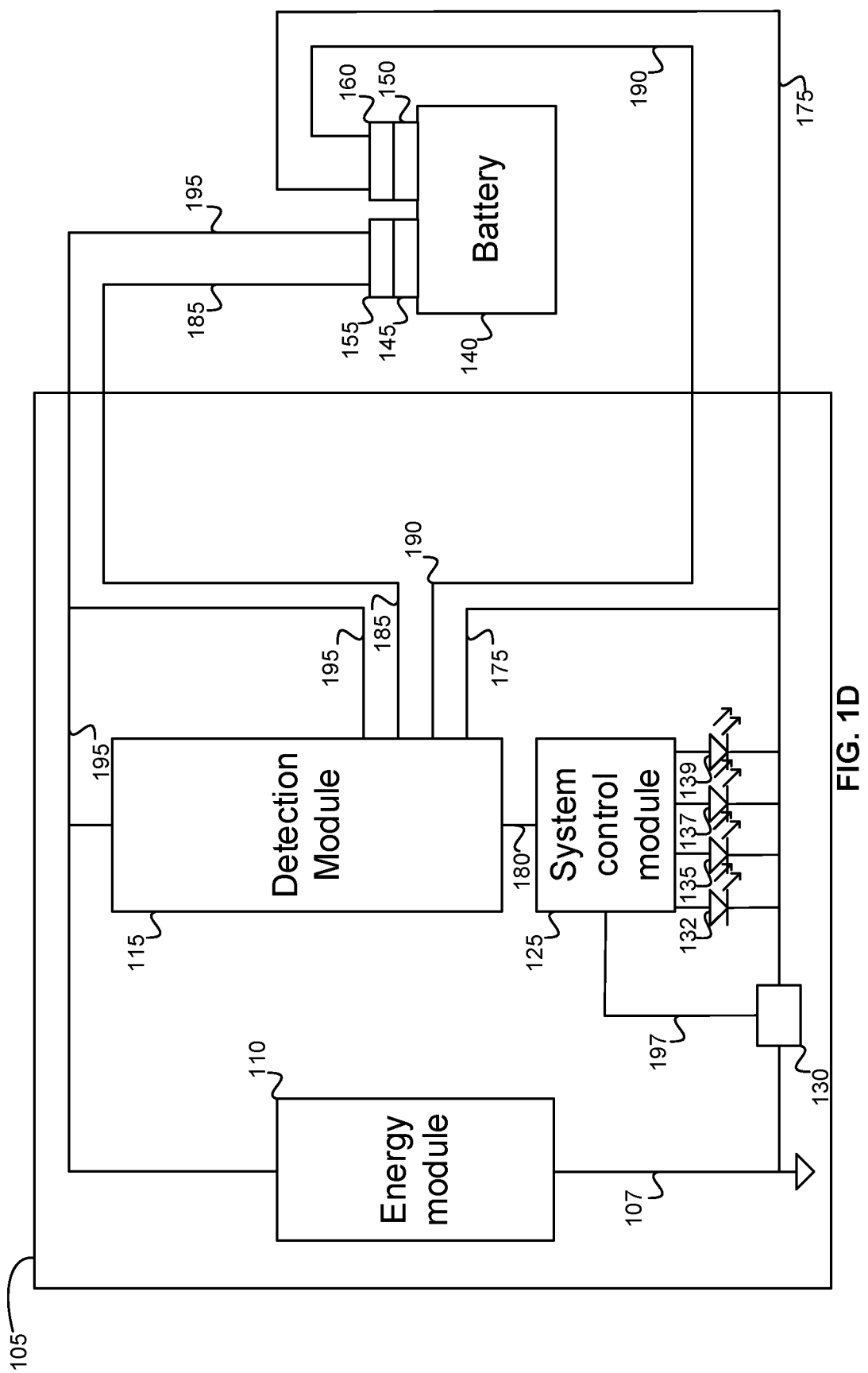
FIG. 1D illustrates a block diagram of the emergency starting power supply with device battery contact impedance detection according to an embodiment of the present disclosure.
Figure 1E:
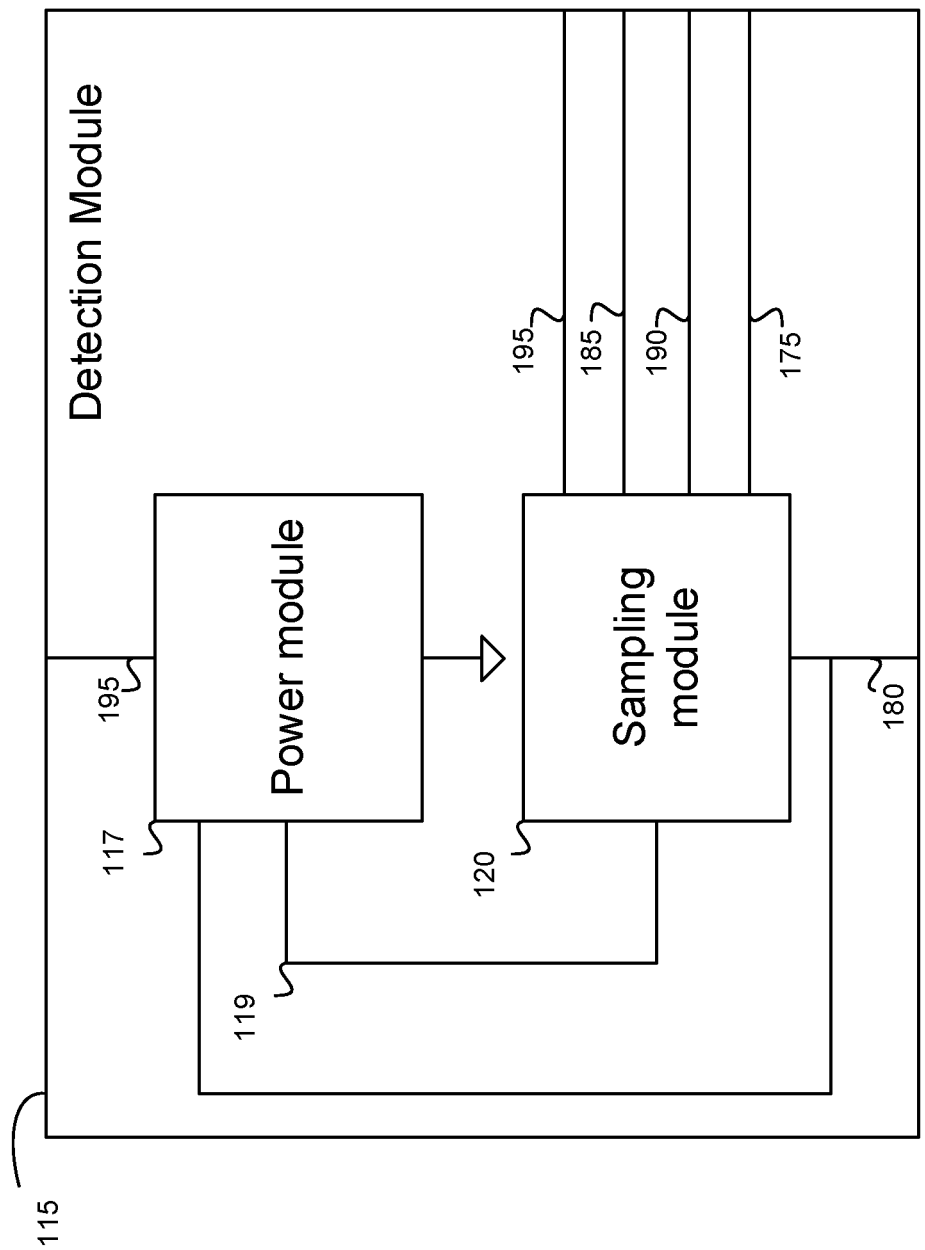
FIG. 1E illustrates a block diagram of the detection module according to an embodiment of the present disclosure.

FIG. 1D performs the same charging and discharging and measurements as FIG. 1C, except that switch 130 is located within the ground circuit instead of being located within the non-ground circuit. Switch 130 is located in the ground circuit when switch 130 comprises an appropriate device acting as a switch. Non-limiting examples of devices acting as a switch can be an N-MOS transistor, a relay or one or more like devices. A person skilled in the art will understand that when switch 130 comprises an N-MOS transistor, a relay or one or more like devices, placing switch 130 in the ground circuit results in emergency power supply 105 operating more reliably and also more safely. FIG. 1E shows power module 117 and sampling module 120 of the detection module 115.

It should be appreciated that power module 117 of detection module 115, which is connected to connection 195, controls either the discharging of battery 140 or charging of battery 140 in pulse mode. In pulse mode, power module 117 discharges or charges battery 140 using a square wave signal with a varying pulse width and varying period, fixed pulse width and a duty cycle of less than fifty percent and also a fixed period, fixed pulse width so that the duty cycle is greater than fifty percent and a fixed period, or a pulse width that has a fifty percent duty cycle and a fixed period. Power module 117 is also connected to sampling module 120 using connection 119 to collect the voltage fluctuation of this current loop.

Sampling module 120 of detection module 115 is connected to wires 195, 175 and to sampling wires 185 and 190. Sampling module 120 is also connected to connection 180, that as previously described herein is a system control module 125 connection. These connections allow for the measurement of battery 140's/device 142's voltage and current. Additionally, system control module 125 and detection module 115 to control battery 140's/device 142's voltage and current collection and measurement.

Figure 2:
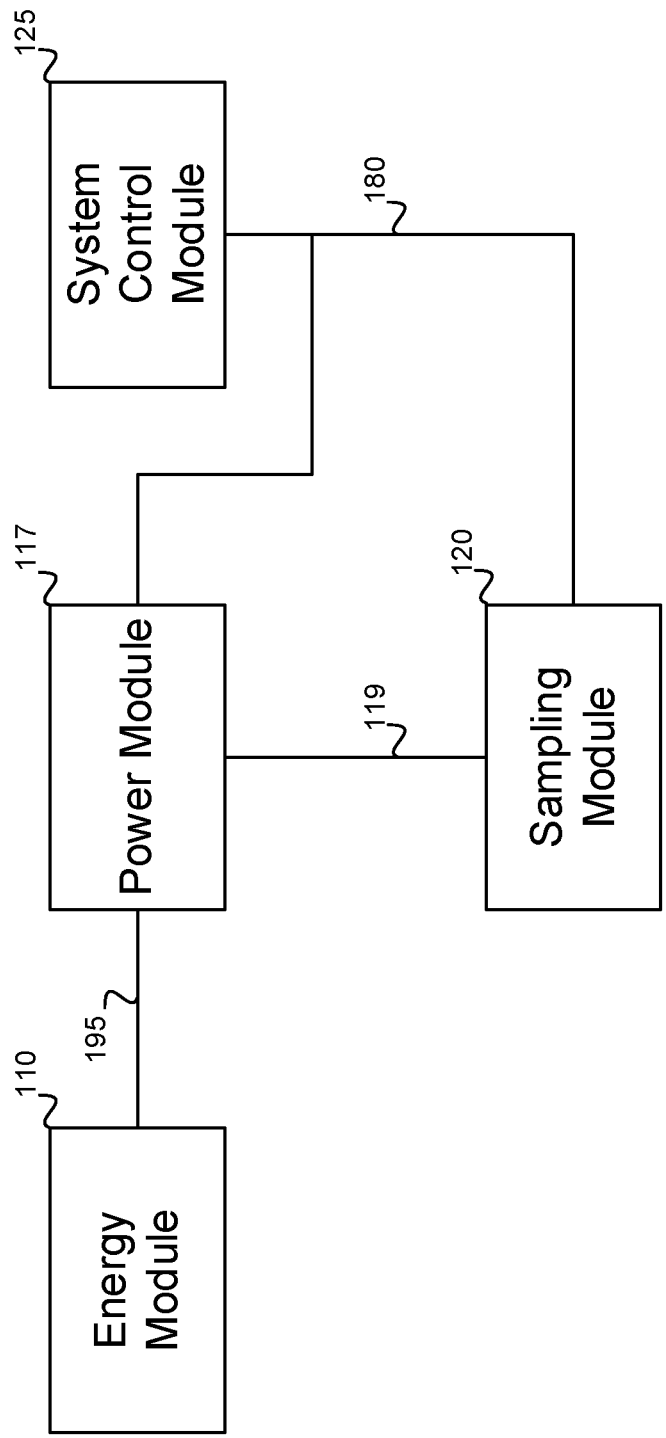
FIG. 2 illustrates the flow of signals between modules according to an embodiment of the present disclosure.

FIG. 2 illustrates the logical connection of system control module 125 with sampling module 120 and power module 117.

Figure 3A:
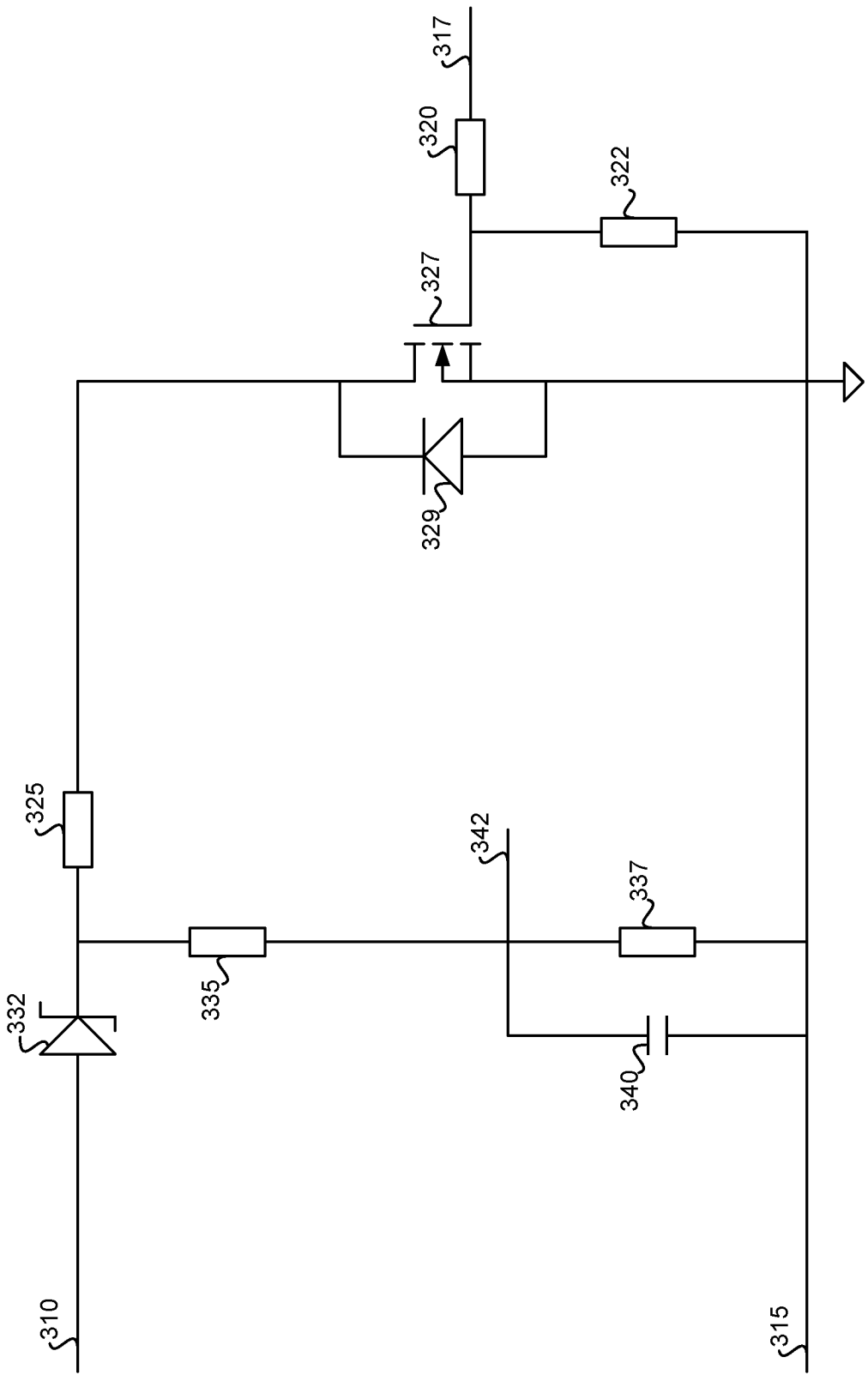
FIG. 3A illustrates a schematic view of the discharge circuit of the power module according to an embodiment of the present disclosure.
Figure 3B:
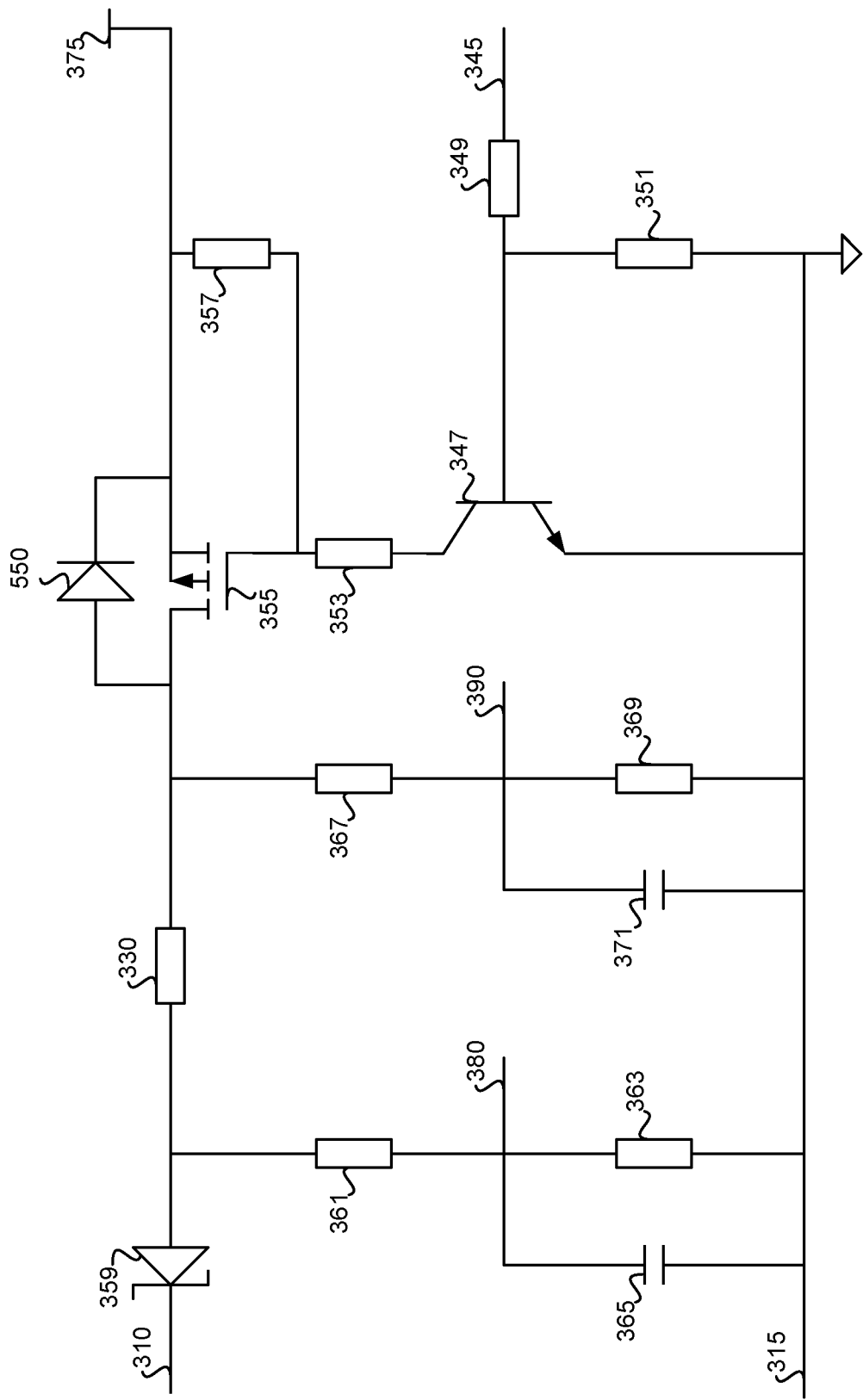
FIG. 3B illustrates a schematic view of the charge circuit of the power module according to an embodiment of the present disclosure.

Sampling module 120 of emergency starting power supply 105 determines the impedance of battery 140's contacts 145 and 150 or device 142's contacts 147 and 152 by power module 117 first detecting the voltage across resistor 325 of FIG. 3A or the voltage across resistor 330 of FIG. 3B. Power module 117 provides this detected voltage to system control module 125 so that system control module 125 can determine the impedance of battery 140 contacts 145 and 150 or device 142's contacts 147 and 152. System control module 125 then divides this voltage by the resistance of resistor 325 to determine the loop current of the current loop path.

FIG. 3A illustrates a schematic diagram of the circuit of power module 117 uses to discharge battery 140 or device 142. FIG. 3B illustrates a schematic diagram of the circuit of power module 115 used to charge battery 140 or device 142.

The discharge circuit of FIG. 3A is enabled using connection 317 which controls transistor 327 and diode 329. A person skilled in the art will understand that the values of resistors 320 and 322 are set to control the voltage applied by connection 317 to the gate of transistor 327. A person skilled in the art will also understand that resistor 320 is effectively the input resistance of transistor 327 and resistor 322 is effectively the gate to source resistor of transistor 327.

Gate resistor 320 can be used to control over-current and reduce overshoot between the drain and source of transistor 327 when it is switching. This control can reduce generation of electromagnetic interference. Gate resistor 320 can also control the switching time, known to those skilled in the art as rise time and fall time of transistor 327.

Gate to source resistor 322 can be used to set a predefined voltage on the gate of transistor 327 in the absence of a voltage applied to connection 317. This predefined voltage can be important because the gate of transistor 327 is a high impedance node and if gate to source resistor 322 does not set a predefined voltage, the gate of transistor 327 is left floating. As a result, when the gate of transistor 327 is left floating, it can assume any voltage resulting from parasitic coupling and noise and as a result, its behaviour is not controlled and the circuit can discharge battery 140 or device 142 in an uncontrolled manner.

The discharge circuit of FIG. 3A incudes Zener diode 332. A person skilled in the art will understand that when Zener diode 332 is reverse biased, this Zener diode, in certain embodiments, will have a voltage of approximately 400 mV across it. This voltage across Zener diode 332 is used to limit the voltage in branches comprised by resistor 335 in series with the parallel combination of resistor 337 and capacitor 340 and the branch comprised by resistor 325 and transistor 327. Wire 342 is the voltage across the parallel combination of resistor 337 and capacitor 340 and is equivalent to the voltage across resistor 325 when transistor 327 is turned on. A person skilled in the art will understand that a transistor can operate in the active region when the transistor is turned on.

The charge circuit of FIG. 3B is enabled using connection 345 which controls transistor 347. A person skilled in the art will understand that the values of resistors 349 and 351 are set to control the voltage applied by connection 345 to the base of transistor 347. A person skilled in the art will also understand that resistor 349 also acts a current limiting resistor that limits current flowing into the base of transistor 347.

Since the current flowing into the base of transistor 347 is multiplied by transistor 347's current gain (transistor 347's ß) and flows as transistor 347's collector current, a person skilled in the art will understand that the values of resistors 357, 353, 349 and 351 are selected so that transistor 347 operates in the proper point between saturation, constant current and breakdown of the transistor 347's family of collector curves.

A person skilled in the art will also understand that the values of resistors 357, 353, 349 and 351 are selected so that the signal applied to connection 345 controls transistor 355 and diode 550.

A person skilled in the art will understand that when Zener diode 359 of charge circuit of FIG. 3B is reversed biased that reversed biased Zener diode 359, in certain embodiments, will have a voltage of approximately 400 m V across it. This person skilled in the art will also understand that the reverse bias of Zener diode 359 is controlled by the voltage applied to connection 345. The voltage across Zener diode 359 can be used to set the voltage across resistor 361 that is in series with the parallel combination of resistor 363 and capacitor 365 and the voltage across resistor 330 that is in series with resistor 367 that is in series with the parallel combination of resistor 369 and capacitor 371.

A person skilled in the art will also understand that voltage 375 sets the source voltage of transistor 355 and also controls the gate to source voltage of transistor 355 so that it is less than the source voltage and equal to or greater than the drain source voltage of transistor 355 so that transistor 355 can operate.

Wire 380 is the voltage across the parallel combination of resistor 363 and capacitor 365. Wire 390 is the voltage across the parallel combination of resistor 369 and capacitor 371. As a result, when diode 550 is forward biased, the voltage that can be measured at wire 390 with respect to ground connection 315 minus the voltage that can be measured at wire 380 with respect to the ground connection 315 is equivalent to the voltage across resistor 330.

Figure 4A:
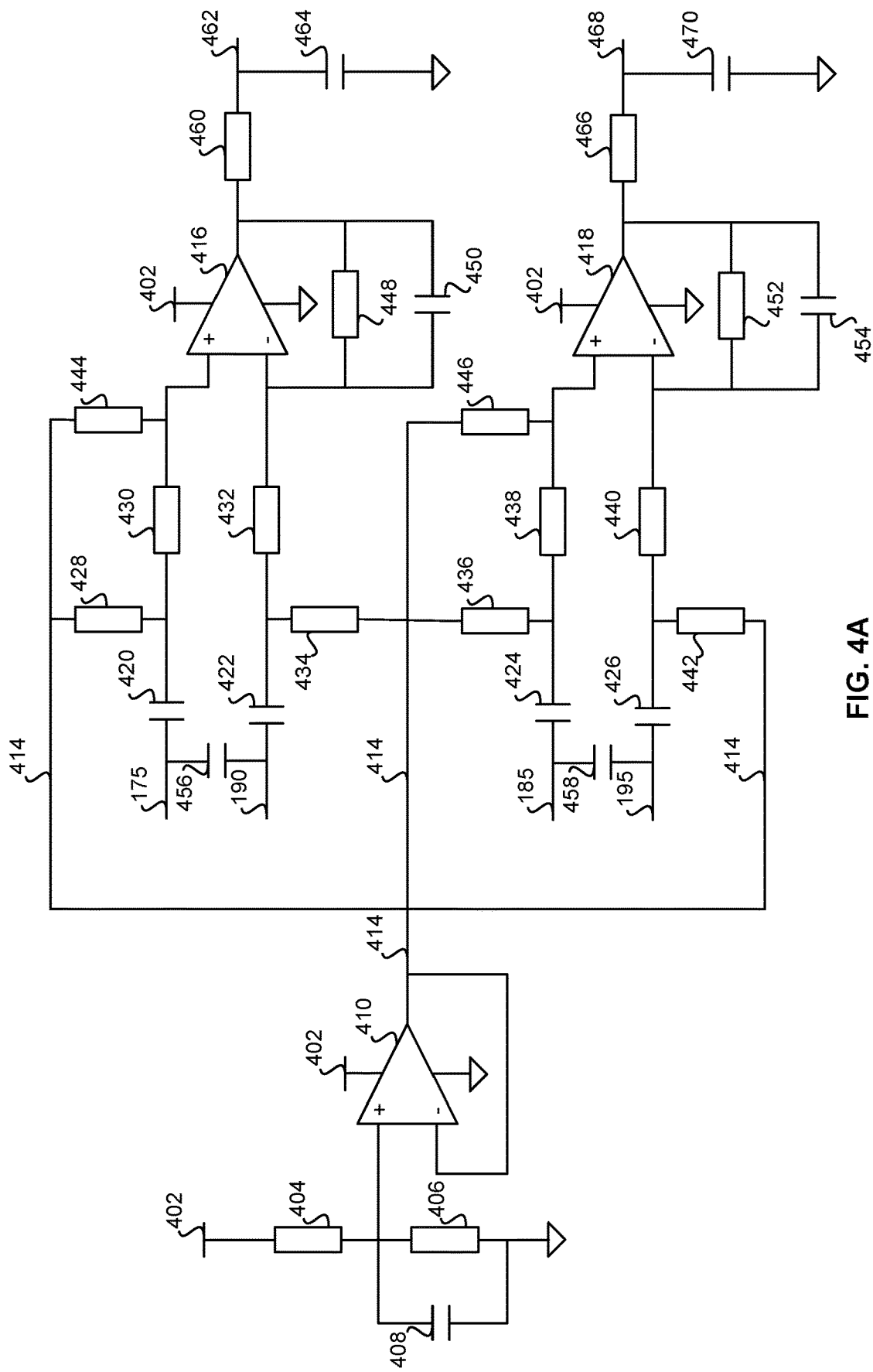
FIG. 4A illustrates a schematic view of the contact impedance detection circuit of the sampling module according to an embodiment of the present disclosure.
Figure 4B:
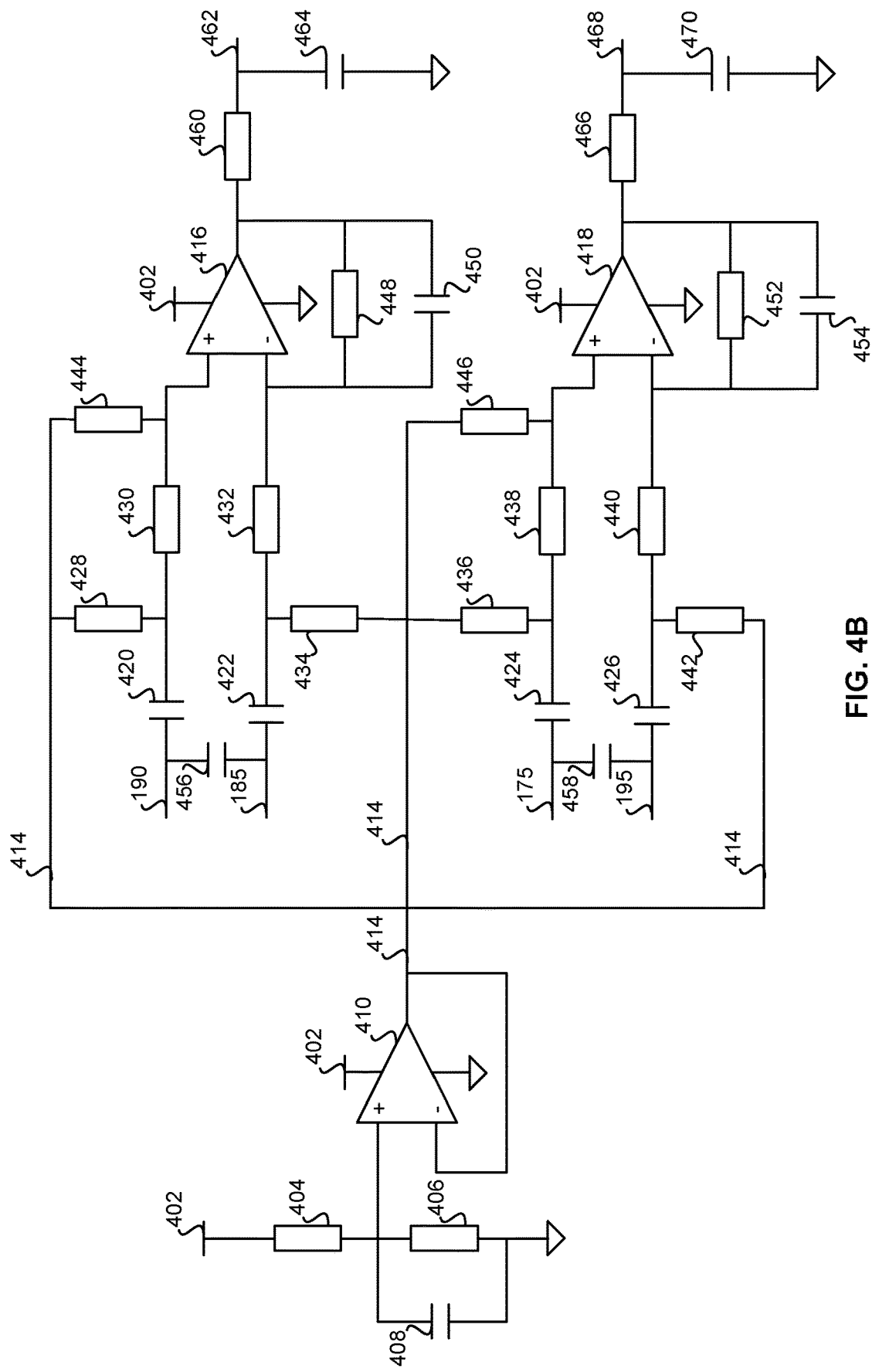
FIG. 4B illustrates a schematic view of an alternative contact impedance detection circuit of the sampling module according to an embodiment of the present disclosure.

The next step in determining the impedance of battery 140 contacts 145 and 150 or device 142 contacts 147 and 152 is to determine the loop voltage. The circuits of FIG. 4A and FIG. 4B are included in the sampling module and are used to determine this loop voltage as well as other electrical characteristics of the circuit and battery 140 contacts 145 and 150 or device 142 contacts 147 and 152. Power module 115 provides this loop voltage to system control module 125 so that system control module 125 can determine the impedance of battery 140 contacts 145 and 150 or device 142 contacts 147 and 152.

To determine the loop internal impedance, the system control module 125 divides the total voltage provided by the circuits illustrated in FIG. 4A and FIG. 4B by the loop current provided by the circuits illustrated in FIG. 3A and FIG. 3B.

System control module 125 is programmed with the factory-calibrated impedance of wires 195 and 175 so that system control module 125 can subtract the impedance of wires 195 and 175 and sampling wires 185 and 190 from the determined loop internal impedance to determine the impedance of battery 140 contacts 145 and 150 or device 142 contacts 147 and 152.

System control module 125 is connected to a user interface comprised by orange light emitting diode (LED) 132, green LED 135, orange LED 137, and green LED 139. LED 132 and LED 135 are used to indicate the contact impedance of clamp 155. LED 137 and LED 139 are used to indicate the contact impedance of clamp 160.

If detection module 115 detects that the value of clamp 155's contact impedance with device 142 terminal 147 or battery 140 terminal 145 is greater than 3 mΩ, then orange LED 132 illuminates. This illumination of orange LED 132 informs the user that the position of either wire 185's or wire 195's, or both, contact point with clamp 155 should be adjusted. Detection module 115 detects contact impedance changes of connection of wires with clamps continuously and in real time and as a result, if detection module 115 detects that the value of clamp 155's contact impedance of device 142 terminal 147 or battery 140 terminal 145 becomes less than 3 mΩ, orange LED 132 extinguishes and green LED 135 illuminates. As a result, when orange LED 132 extinguishes and green LED 135 illuminates, the user is informed that clamp 155's contact impedance with device 142 terminal 147 or battery 140 terminal 145 is correct.

If detection module 115 detects that the value of clamp 160's contact impedance with device 142 terminal 152 or battery 140 terminal 150 is greater than 3 mΩ, then orange LED 137 illuminates. This illumination of orange LED 137 informs the user that the position of either wire 175's or wire 190's, or both, contact point with clamp 160 should be adjusted. Detection module 115 detects contact impedance changes of connection of wires with clamps continuously and in real time and as a result, if detection module 115 detects that the value of clamp 160's contact impedance of device 142 terminal 152 or battery 140 terminal 150 becomes less than 3 mΩ, orange LED 137 extinguishes and green LED 139 illuminates. As a result, when orange LED 137 extinguishes and green LED 139 illuminates, the user is informed that clamp 160's contact impedance with device 142 terminal 152 or battery 140 terminal 150 is correct.

In some embodiments, LEDs 132, 135, 137 and 139 can be replaced with an equivalent number of buzzers, displays and the like so that the user is informed when the impedance must be adjusted and also is prompted when the impedance is acceptable.

The user can use the above procedure to adjust the contact impedance of clamp 155 and then the contact impedance of clamp 160. Or, the user can use the above procedure to adjust the contact impedance of both clamps 155 and 160 at the same time.

The prompts provided by a user interface of the emergency power supply 105 are related to the determined impedance of battery 140 contacts 145 and 150 or device 142 contacts 147 and 152. The user uses these prompts to help them decide how to adjust the impedance of wires 195 and 175. The emergency power supply 105 provides these prompts so that the impedance of first clamp 155 and second clamp 160 are optimized with contacts 145 and 150 so that the emergency starting power supply 105 provides the power required to start the device's motor(s) or engine.

The circuit illustrated by FIG. 4A determines the voltage difference between the point of attachment of wire 195 and sampling wire 185 to clamp 155. FIG. 4A also determines the voltage difference between the point of attachment of wire 175 and sampling wire 190 to clamp 160.

The circuit illustrated by FIG. 4A includes a voltage follower circuit comprised of voltage source 402, resistors 404 and 406, capacitor 408 and operational amplifier 410 (with rail voltages 402 and ground). The output of this circuit is related to the voltage divider comprised by resistor 404 connected in series with the parallel combination of resistor 406 and capacitor 408. A person skilled in the art will understand that the ratio of the values of resistor 404, resistor 406 (in parallel with capacitor 408) are selected to define the voltage that is applied to the non-inverting input of operational amplifier 410. The output of this voltage follower circuit sets the reference voltage for the differential amplifier 1, connected to node 414, that includes operational amplifiers 416 and differential amplifier 2, connected to node 414, that includes operational amplifier 418.

The circuit illustrated by FIG. 4A determines voltage of contact 145 of battery 140 and the voltage of contact 150 of battery 140 or the voltage of device 142 contact 147 and the voltage of device 142 contact 152. The circuit of FIG. 4A does this by determining the difference between the voltage at the attachment point of wire 195 and sampling wire 185 to clamp 155. The circuit of FIG. 4A also does this by determining the difference between the voltage at the attachment point of and the attachment point of wire 175 and sampling wire 190 to clamp 160.

A person skilled in the art will understand after analyzing differential amplifier 1's circuit and differential amplifier 2's circuit of FIG. 4A that the connection of resistor 444 and resistor 446 to node 414 allows differential amplifier circuit 1 to detect the voltage of wire 175 being less than the voltage of wire 190 and differential amplifier circuit 2 to detect the voltage of wire 185 being less than the voltage of wire 195.

A person skilled in the art will also understand that the circuit topologies of differential amplifier 1 and differential amplifier 2, illustrated by FIG. 4A, behave differently than prior art differential amplifiers that connect resistor 444 and resistor 446 to ground. The person skilled in the art will come to this understanding because this person will understand that connecting resistor 444 to ground will cause differential amplifier 1 to only detect that the voltage applied to wire 175 is greater than the voltage applied to wire 190 instead of the voltage of wire 175 being less than the voltage of wire 190 as disclosed herein. The person skilled in the art will also understand this because this person will understand that connecting resistor 446 to ground will cause differential amplifier 2 to only detect that the voltage applied to wire 185 is greater than the voltage applied to wire 195 instead of the voltage of wire 185 being less than the voltage of wire 195 as disclosed herein.

FIG. 4A illustrates differential amplifier circuit 1 including DC blocking capacitor 420 and DC blocking capacitor 422. A person skilled in the art will understand that these DC blocking capacitors "appear electrically" as an open circuit to DC voltages and will, as a result, not allow differential amplifier circuit 1 to detect DC voltages. DC blocking capacitor 420 and DC blocking capacitor 422 have been included in circuit 1 so differential amplifier circuit 1 will detect the dynamic voltage change that occurs when battery 140 or device 142 is charged and discharged by measuring the voltage difference between the point of attachment of wire 175 and sampling wire 190 to clamp 160 to contact 150 of battery 140 or contact 152 of device 142.

FIG. 4A also illustrates differential amplifier circuit 2 including DC blocking capacitor 424 and DC blocking capacitor 426. A person skilled in the art will understand that these DC blocking capacitors "appear electrically" as an open circuit to DC voltages and will, as a result, not allow differential amplifier circuit 2 to detect DC voltages. DC blocking capacitor 424 and DC blocking capacitor 426 have been included in circuit 2 so that differential amplifier circuit 2 will detect the dynamic voltage change that occurs when battery 140 or device 142 is charged and discharged by measuring the voltage difference between the point of attachment of wire 195 and sampling wire 185 to clamp 155 of battery 140 contact 145 or of device 142 contact 147.

The circuit illustrated by FIG. 4B also includes the voltage follower circuit comprised of voltage source 402, resistors 404 and 406, capacitor 408 and operational amplifier 410 (with rail voltages 402 and ground). The output of this circuit is related to the voltage divider comprised by resistor 404 connected in series with the parallel combination of resistor 406 and capacitor 408. A person skilled in the art will understand that the ratio of the values of resistor 404, resistor 406 (in parallel with capacitor 408) are selected to define the voltage that is applied to the non-inverting input of operational amplifier 410. The output of this voltage follower circuit sets the reference voltage for the differential amplifier 1, connected to node 414, that includes operational amplifiers 416 and differential amplifier 2, connected to node 414, that includes operational amplifier 418.

The circuit illustrated by FIG. 4B determines the total voltage, minus the voltage of the battery or device by determining the difference between the voltage at the attachment point of sampling wire 190 to clamp 160 attached to battery 140 contact 150 or device 142 contact 152 and sampling wire 185 to clamp 155 attached to battery 140 contact 145 or device 142 contact 147. FIG. 4B also determines the difference between the voltage at the attachment point of wire 175 to clamp 160 attached to battery 140 contact 150 or device 142 contact 152 and the attachment point of wire 195 to clamp 155 attached to battery 140 contact 145 or device 142 contact 147.

A person skilled in the art will understand after analyzing differential amplifier 1's circuit and differential amplifier 2's circuit of FIG. 4B that the connection of resistor 444 and resistor 446 to node 414 allows differential amplifier circuit 1 to detect the voltage of wire 190 being less than the voltage of wire 185 and differential amplifier circuit 2 to detect the voltage of wire 175 being less than the voltage of wire 195.

A person skilled in the art will also understand that the circuit topologies of differential amplifier 1 and differential amplifier 2, illustrated by FIG. 4B, behave differently than prior art differential amplifiers that connect resistor 444 and resistor 446 to ground. The person skilled in the art will come to this understanding because this person will understand that connecting resistor 444 to ground will cause differential amplifier 1 to only detect that the voltage applied to wire 190 is greater than the voltage applied to wire 185 instead of the voltage of wire 190 being less than the voltage of wire 185 as disclosed herein. The person skilled in the art will also come to this understanding because this person will understand that connecting resistor 446 to ground will cause differential amplifier 2 to only detect that the voltage applied to wire 175 is greater than the voltage applied to wire 195 instead of the voltage of wire 175 being less than the voltage of wire 195 as disclosed herein.

FIG. 4B illustrates differential amplifier circuit 1 including DC blocking capacitor 420 and DC blocking capacitor 422. A person skilled in the art will understand that these DC blocking capacitors "appear electrically" as an open circuit to DC voltages and will, as a result, not allow differential amplifier circuit 1 to detect DC voltages. DC blocking capacitor 420 and DC blocking capacitor 422 have been included in circuit 1 so differential amplifier circuit 1 will detect the dynamic voltage change that occurs when battery 140 or device 142 is charged and discharged by determining the difference between the voltage at the attachment point of wire 185 at clamp 155 attached to battery 140 contact 145 or device 142 contact 147 and the attachment point of wire 190 at clamp 160 attached to battery 140 contact 150 or device 142 contact 152.

FIG. 4B also illustrates differential amplifier circuit 2 including DC blocking capacitor 424 and DC blocking capacitor 426. A person skilled in the art will understand that these DC blocking capacitors "appear electrically" as an open circuit to DC voltages and will, as a result, not allow differential amplifier circuit 2 to detect DC voltages. DC blocking capacitor 424 and DC blocking capacitor 426 have been included in circuit 2 so that differential amplifier circuit 2 will detect the dynamic voltage change that occurs when battery 140 or device 142 is charged or discharged by determining the difference between the voltage of wire 175 at the attachment point of clamp 160 attached to battery 140 contact 150 or device 142 contact 152 and the voltage of wire 195 at the attachment point clamp 155 attached to battery 140 contact 145 or device 142 contact 147.

This dynamic voltage change detected by FIG. 4A's and FIG. 4B's differential amplifier circuit 1 and differential amplifier circuit 2 when determining the voltage difference between sampling wire 190 at its point of attachment to clamp 160 to contact 150 of battery 140 or to contact 152 of device 142 and sampling wire 185 at its point of attachment to clamp 155 to contact 145 of battery 140 or to contact 147 of device 142. This circuit also determines the voltage difference between wire 175 at its point of attachment to clamp 160 to contact 150 of battery 140 or to contact 152 of device 142 and wire 195 at its point of attachment of clamp 155 to contact 145 of battery 140 or contact 147 of device 142. These measurements are required to determine the impedance of contact 145 of battery 140 or contact 147 of device 142 and to also determine the impedance of contact 150 of battery 140 or contact 152 of device 142.

The power supply configured to power a device. The power supply comprising a first clamp is configured to connect to a positive contact of the device or battery and a second clamp is configured to connect to a negative contact of the device or battery. The power supply also comprising a detection module, connected to the first clamp and the second clamp, used to detect the impedance of the device's/battery's positive contact, and also used to detect the impedance of the device's/battery's negative contact. The power supply further comprising a power switch, connected between the first clamp and an energy module or between the second clamp and the energy module. The power supply also comprising a system control module is electrically connected to the detection module to obtain the contact impedance of the first clamp and the contact impedance of the second clamp and provides a signal to the power switch to turn on the power switch so that the energy module provides energy to the first clamp and the second clamp.

The power supply further comprises a first wire with a first end and a second end, a second wire with a first end and a second end, a first sampling wire with a first end and a second end and a second sampling wire with a first end and a second end.

The power supply where the first clamp is connected independently to the first end of the first wire and also to the first end of the first sampling wire and where the second clamp is connected independently to the first end of the second wire and also to the first end of the second sampling wire.

The power supply further comprises a contact detection module connected to the second end of the first wire and to the second end of the first sampling wire and to the second end of the second wire and also to the second end of the second sampling wire.

The power supply further comprises a sampling module and a power module.

The power supply where the detection module includes the sampling module and the power module.

The power supply where the detection module detects the impedance of the positive contact of the device or battery using loop current and loop internal impedance and impedance of the first wire and also detects the impedance of the negative contact of the device or battery using the loop current and loop internal impedance and the impedance of the second wire.

The power supply further comprises an output impedance connected to the first wire and the second wire, the output impedance of the first wire and the output impedance of the second wire are configured to be individually adjustable by a user of the power supply.

The power supply further comprises providing prompts from a user interface to the user to adjust the output impedance, the prompts related to the impedance of the connection to the positive contact of the device/battery and the impedance of the connection to the negative contact of the device/battery.

The power supply where the energy module comprises a second battery and the second battery is a lead acid battery or a lithium battery.

Although the present invention has been described with reference to specific features and embodiments thereof, it is evident that various modifications and combinations can be made thereto without departing from the disclosure. The specification and drawings are, accordingly, to be regarded simply as an illustration of the disclosure as defined by the appended claims, and are contemplated to cover any and all modifications, variations, combinations or equivalents that fall within the scope of the present disclosure.

We claim:

1. A power supply configured to power a device, the power supply comprising:
    a first clamp is configured to connect to a positive contact of the device and a second clamp is configured to connect to a negative contact of the device;
    a detection module, connected to the first clamp and the second clamp, used to detect the impedance of the device's positive contact, and also used to detect the impedance of the device's negative contact;
    a power switch, connected between the first clamp and an energy module or between the second clamp and the energy module;
    a system control module is electrically connected to the detection module to obtain the contact impedance of the first clamp and the contact impedance of the second clamp; and
    provides a signal to the power switch to turn on the power switch so that the energy module provides energy to the first clamp and the second clamp.

2. The power supply of claim 1 further comprises:
    a first wire with a first end and a second end;
    a second wire with a first end and a second end;
    a first sampling wire with a first end and a second end; and
    a second sampling wire with a first end and a second end.

3. The power supply of claim 2 wherein the first clamp is connected independently to the first end of the first wire and also to the first end of the first sampling wire and wherein the second clamp is connected independently to the first end of the second wire and also to the first end of the second sampling wire.

4. The power supply of claim 2 further comprises a contact detection module connected to the second end of the first wire and to the second end of the first sampling wire and to the second end of the second wire and also to the second end of the second sampling wire.

5. The power supply of claim 1 further comprises a sampling module and a power module.

6. The power supply of claim 5 wherein the detection module includes the sampling module and the power module.

7. The power supply of claim 2 wherein the detection module detects the impedance of the positive contact of the device using loop current and loop internal impedance and impedance of the first wire and also detects the impedance of the negative contact of the device using the loop current and loop internal impedance and the impedance of the second wire.

8. The power supply of claim 7 further comprises providing prompts from a user interface to the user to adjust the impedance, the prompts related to the impedance of the connection to the positive contact of the device and the impedance of the connection to the negative contact of the device.

9. The power supply of claim 1 wherein the energy module comprises a second battery and the second battery is a lead acid battery or a lithium battery.

10. A power supply configured to power a device, the power supply comprising:
    a first clamp is configured to connect to a positive contact of a battery and a second clamp is configured to connect to a negative contact of the battery;
    a detection module, connected to the first clamp and the second clamp, used to detect the impedance of the battery's positive contact, and also used to detect the impedance of the battery's negative contact;
    a power switch, connected between the first clamp and an energy module or between the second clamp and the energy module;
    a system control module is electrically connected to the detection module to obtain the contact impedance of the first clamp and the contact impedance of the second clamp; and
    provides a signal to the power switch to turn on the power switch so that the energy module provides energy to the first clamp and the second clamp.

11. The power supply of claim 10 further comprises:
    a first wire with a first end and a second end;
    a second wire with a first end and a second end;
    a first sampling wire with a first end and a second end; and
    a second sampling wire with a first end and a second end.

12. The power supply of claim 11 wherein the first clamp is connected independently to the first end of the first wire and also to the first end of the first sampling wire and wherein the second clamp is connected independently to the first end of the second wire and also to the first end of the second sampling wire.

13. The power supply of claim 11 further comprises a contact detection module connected to the second end of the first wire and to the second end of the first sampling wire and to the second end of the second wire and also to the second end of the second sampling wire.

14. The power supply of claim 10 further comprises a sampling module and a power module.

15. The power supply of claim 14 wherein the detection module includes the sampling module and the power module.

16. The power supply of claim 11 wherein the detection module detects the impedance of the positive contact of the battery using loop current and loop internal impedance and impedance of the first wire and also detects the impedance of the negative contact of the battery using the loop current and loop internal impedance and the impedance of the second wire.

17. The power supply of claim 16 further comprises providing prompts from a user interface to the user to adjust the impedance, the prompts related to the impedance of the connection to the positive contact of the battery and the impedance of the connection to the negative contact of the battery.

18. The power supply of claim 10 wherein the energy module comprises a second battery and the second battery is a lead acid battery or a lithium battery.

\* \* \* \* \*